United States Patent
McClure (12)

(10) Patent No.: US 6,297,996 B1
(45) Date of Patent: Oct. 2, 2001

(54) TEST MODE ACTIVATION AND DATA OVERRIDE

(75) Inventor: David C. McClure, Carrollton, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 09/457,558

(22) Filed: Dec. 9, 1999

Related U.S. Application Data

(63) Continuation of application No. 08/587,709, filed on Jan. 19, 1996, now Pat. No. 6,144,594.

(51) Int. Cl.[7] .................................................. G11C 7/00

(52) U.S. Cl. ..................................... 365/201; 365/189.09

(58) Field of Search ............................... 365/201, 189.09, 365/226

(56) References Cited

U.S. PATENT DOCUMENTS

| | | | |
|---|---|---|---|
| 5,072,137 | 12/1991 | Slemmer | 307/465 |
| 5,072,138 | 12/1991 | Slemmer et al. | 307/465 |
| 5,115,146 | 5/1992 | McClure | 307/272.3 |
| 5,134,586 | 7/1992 | Steele | 365/201 |
| 5,134,587 | 7/1992 | Steele | 365/201 |
| 5,161,159 | 11/1992 | McClure et al. | 371/22.1 |
| 5,299,203 | 3/1994 | Steele | 371/221 |
| 5,408,435 | 4/1995 | McClure et al. | 365/201 |
| 5,424,988 | 6/1995 | McClure et al. | 365/201 |
| 5,440,178 | 8/1995 | McClure | 327/34 |

*Primary Examiner*—Vu A. Le
(74) *Attorney, Agent, or Firm*—Theodore E. Galanthay; Lisa K. Jorgenson; Peter J. Thoma

(57) ABSTRACT

A memory device with a test mode control circuit for entering a test mode responsive to a high on the Vss pin or a low on the Vcc pin that supply power to the output pins during normal operation of the memory device. In test mode the wordlines and bitlines of the memory remain active from the time they are activated, typically when the clock switched from a first to a second logic state, until the clock switches back to the first logic state.

10 Claims, 6 Drawing Sheets

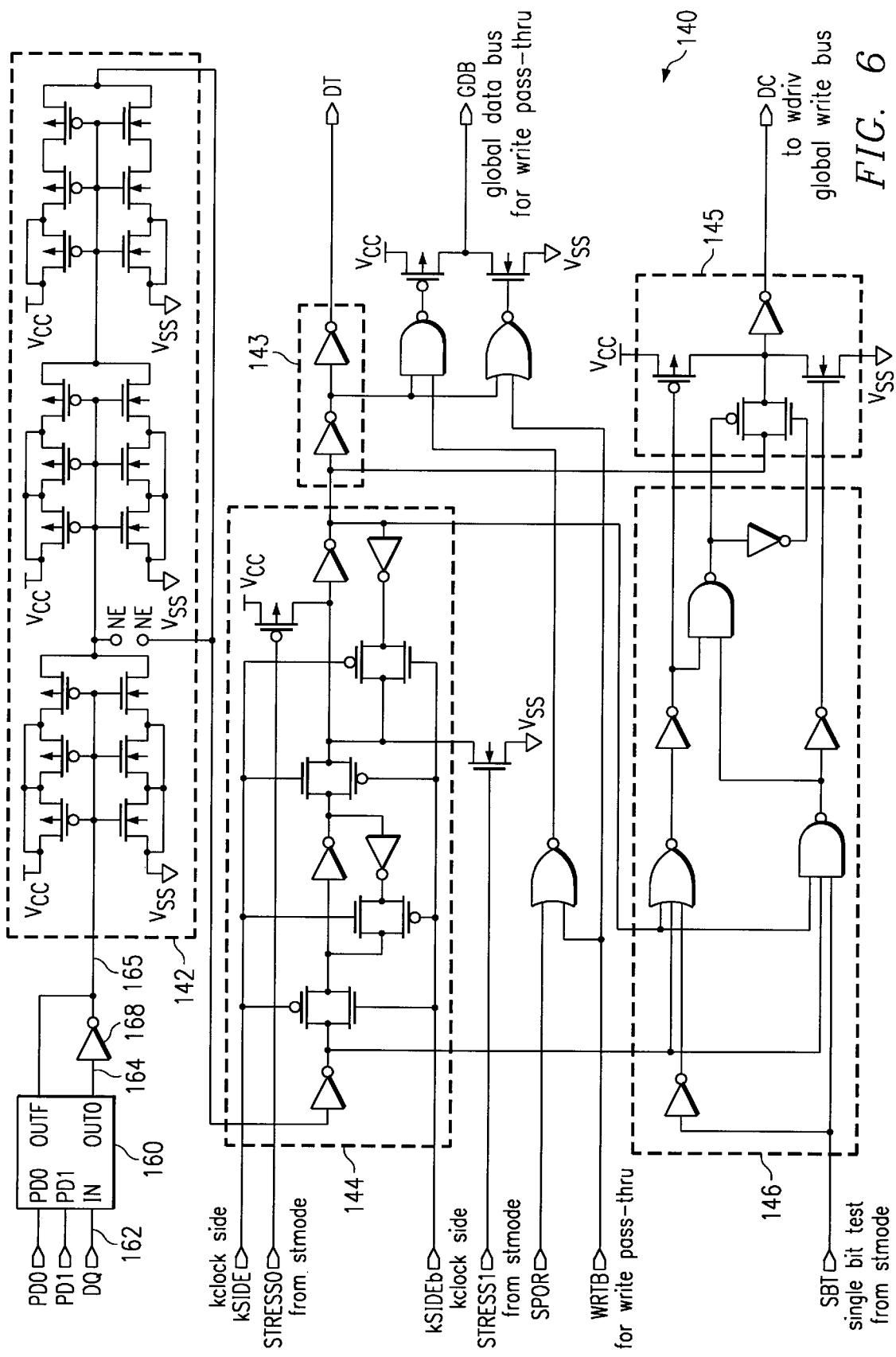

TEST MODE ACTIVATION AND DATA OVERRIDE

CROSS-REFERENCE TO RELATED APPLICATIONS

This application is a continuation of U.S. patent application Ser. No. 08/587,709, filed Jan. 19, 1996, now U.S. Pat. No. 6,144,594.

The following pending U.S. Patent Applications by David C. McClure entitled: "Architecture Redundancy" Ser. No. 08/582,424, and "Redundancy Control," Ser. No. 08/580,827, which were filed Dec. 29, 1995, and have the same ownership as the present application, and to that extent are related to the present application, which are incorporated herein by reference; and entitled: Pipelined Chip Enable Control Circuitry and Methodology," Ser. No. 08/588,730, "Output Driver Circuitry Having a Single Slew Rate Resistor," Ser. No. 08/588,988, "Synchronous Stress Test Control," Ser. No. 08/589,015, "Write Pass Through Circuit," Ser. No. 08/588,622, "Data-Input Device for Generating Test Signals on Bit and Bit-Complement Lines," Ser. No. 08/588,762, "Synchronous Output Circuit," Ser. No. 08/588,901, "Write Driver Having a Test Function," Ser. No. 08/589,141, "Circuit and Method for Tracking the Start of a Write to a Memory Cell," Ser. No. 08/589,139, "Circuit and Method for Terminating a Write to a Memory Cell," Ser. No. 08/588,737, "Clocked Sense Amplifier With Word Line Tracking," Ser. No. 08/587,728, Memory-Row Selector Having a Test Function, "Ser. No. 08/589,140, "Synchronous Test Mode Initialization," Ser. No. 08/588,729, "Device and Method for Isolating Bit Lines From a Data Line," Ser. No. 08/588,740, "Circuit and Method for Setting the Time Duration of a Write to a Memory Cell," Ser. No. 08/587,711, "Low-Power Read Circuit and Method for Controlling a Sense Amplifier," Ser. No. 08/589,024, "Device and Method for Driving a Conductive Path With a Signal," Ser. No. 08/587,708, and "Burst Counter Circuit and Method of Operation Thereof," Ser. No. 08/589,023, all of which have the same effective filing date and ownership as the present application, and to that extent are related to the present application, which are incorporated herein by reference.

BACKGROUND AND SUMMARY OF THE INVENTION

The present invention relates to the field of semiconductor memories, and is more specifically directed to special test modes for exercising such memories, and more specifically to the operation of burn-in test modes for such memories.

Integrated circuits typically operate for long periods of time without failure. However, a significant number of integrated circuits fail within the first days of operation. This infant failure of circuits is unacceptable to equipment manufacturers who incorporate the circuit into their equipment. Therefore, circuit manufacturers must find those circuits subject to infant failure.

Circuits subject to infant failure usually test good in the initial tests prior to operation, but will fail a short time after they are used. One method of detecting circuits subject to infant failure is to test them under extreme conditions to accelerate the aging of the circuit. Circuits subject to infant failure will fail under these conditions. The circuits that do not fail will typically operate for a long period of time.

One way to test circuits under extreme conditions is to place them in a burn-in oven to elevate the temperature of the circuit. The components of the circuit are then exercised by applying voltages significantly above the normal operating voltage of the circuit. This is typically done after the circuit is packaged, and the over-voltages are applied to the pins of the device, although the circuit can be placed in a burn-in oven before it is packaged and the over-voltages applied to the pads by connecting the pads to the probes of test equipment. When the circuit is packaged after testing the entire device is placed into a bread board with many other devices and all are tested at the same time. The time savings in testing all of the devices at the same time compared to the time that would be required in testing the unpackaged circuits individually on testers or connecting all the unpackaged circuits to a testing tape and testing them simultaneously outweighs the cost of packaging the circuits that fail during the burn-in test.

The burn-in test can require many hours, typically anywhere from one to ninety-six hours. The burn-in cycle is typically long, it can be up to several microseconds. As observed by the current inventor, the cycle time of a circuit can be much shorter than that. It can be as low as 5 ns. Thus, after 5 ns the component being exercised is inactive, due to the circuit internally timing out, wasting 99.5% of the burn-in cycle.

The test modes, including the burn-in test mode where the device is exercised in a burn-in oven, can be entered in several ways. One way of entering the test mode is to set aside a pin for entering the test mode. However, most devices are pin limited. All the pins on the device are already used for some functionality and to set one of them aside for testing would require giving up some functionality, making the device less competitive. Another problem with setting aside a pin for testing is that it changes the pinout of the device from the standard pinout and makes it not compatible with similar devices by other manufacturers where that pin is used for some functionality.

Another way to enter the test mode is clocking and latching the required test mode conditions into the circuit. This does not tie up a pin either on a permanent basis or even while the device is in the test mode. Unfortunately though this allows the test mode to be entered accidentally if the test conditions are clocked and latched into the device during regular use of the circuit or during power up. Accidentally entering the test mode can significantly alter the data stored in the device when the device is a memory circuit. Additionally, since the test conditions are now latched into the device it is very difficult to exit the test mode. Furthermore, this test may be difficult to enter into in the burn-in oven because typically burn-in ovens have limited capabilities in controlling and clocking the signals.

The test mode can also be entered by supplying a voltage higher than the operating voltage of the device (an over-voltage) to one or more pins for the duration of the test mode. This poses the problem of entering the test mode accidentally due to overshoots on the selected pin due to noise. This again poses the problem of possible loss of data stored in the device due to the replacement of the user's data. Additionally, because the burn-in oven may have limited control of signals, not all burnin ovens are capable of over-voltages, so this method of entering the bumn-in test mode is only available for some bumn-in ovens.

Further background on memories can be found in: Prince, Betty, SEMICONDUCTOR MEMORIES, A HANDBOOK OF DESIGN, MANUFACTURE, AND APPLICATION, 2nd ed., John Wiley & Sons, 1991; ISSCC proceedings from 1975 to the present, all incorporated herein by reference.

SUMMARY THE INVENTION

The present application discloses methods and circuits for a memory device to enter a test mode by setting a first power supply terminal to the opposite logic state it is set to in the normal operation mode. Once the memory device enters the test mode the circuitry that resets the memory device after a read or write mode is disabled and the reset is controlled by a test mode cycle control node. This allows the wordlines and bitlines of the memory device to be stressed for a longer period during the test mode by reducing the frequency at which a reset is generated. In a preferred embodiment of the invention the test mode cycle control node is connected to an internal or external clock and the cycle of the clock is lengthened.

In the preferred embodiment of the invention the first power supply terminal is the power supply terminal of the input/output pins. In this embodiment a test mode write data pin instead of the input/output pins is used to generate a data state to write to the memory cell.

Once the test mode is entered it should test every component of the circuit. When the circuit is a memory device it is the goal to exercise the wordlines in both a high and a low state for some significant period of time, it being particularly important to exercise the wordlines in a high data state. The burn-in cycle is long; it can range from hundreds of nanoseconds up to a full microsecond. Unfortunately, the circuit cycles at a much faster speed. For some of the faster memory circuits the cycle time can be as low as 5 nanoseconds.

A significant advantage of this invention is that the wordlines and bitlines can be made active for a much larger duration of the burn-in cycle. As recognized by the current inventor, in the prior art the wordlines and bitlines of a memory device only remain active for the circuit's effective time active per cycle of the normal operational mode. The circuit then internally times out and the wordlines and bitlines become inactive, and therefore not under stress, for the remainder of the burnin cycle, not utilizing over 90% of the burn-in cycle. In order to stress the wordlines and bitlines for the full duration of a burn-in cycle the circuit will have to stay in the burn-in oven for as many burn-in cycles as needed for the circuit's effective time active per cycle to add up to the effective time active per burn-in cycle, each time wasting over 90% of the burn-in cycle time. For example, if the burn-in cycle is 1000 ns, and the circuits cycle is 5 ns, the given wordline and associated bitlines remain active for only 0.5% of the burn-in cycle. To stress a wordline and bitline for the full 1000 ns of a burn-in cycle would require that they remain in the burn-in oven for 200 burn-in cycles, a total of 200 $\mu$s (200,000 ns), only 1000 ns of which is used, and the remaining 199 $\mu$s wasted. The memory device must be kept in the burn-in oven 200 times longer than if the wordline was active for the entire burn-in cycle. It is usually desired to stress each wordline for about 1 second, so the above process is repeated several thousand times for each wordline.

This is repeated for every wordline in the memory device. There may be several thousand wordlines in the memory device. By reducing the amount of time the memory device is in the burnin oven by 99.5% the total burn-in test time is significantly reduced, providing equally significant savings in manufacturing costs.

This invention provides the critical advantage of reducing the amount of time memory device needs to remain in the burn-in oven without reducing the amount of time the wordlines, and bitlines of the memory device are active in the burn-in test mode of the memory device. This greatly reduces the manufacturing costs of the memory device.

One advantage of the present invention is that it is highly unlikely the test mode will be entered accidentally.

Another advantage of this invention is that it increases the amount of time the components of a memory device are stressed in a burn-in test mode without increasing the amount of time the memory device is tested.

A particularly advantageous use of the current invention is in large memory devices.

Other advantages and objects of the invention will be apparent to those of ordinary skill in the art having reference to the following specification together with the drawings.

BRIEF DESCRIPTION OF THE DRAWINGS

FIG. 6 is an electrical diagram, in schematic form, of the data input buffer.

DETAILED DESCRIPTION OF THE PREFERRED EMBODIMENTS

Figure 1A:
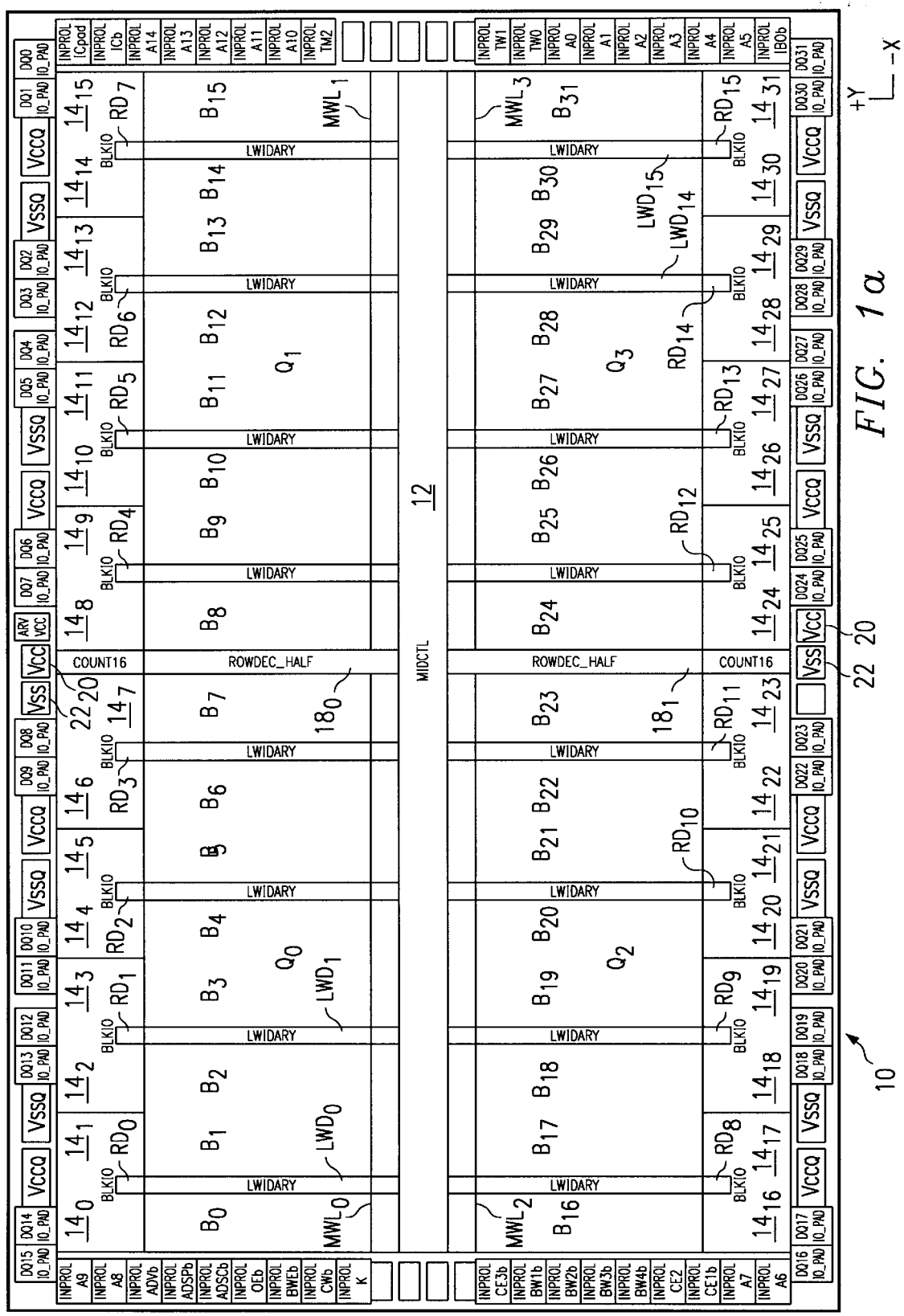
FIG. 1a is an electrical diagram, in block form, of an integrated circuit memory device.
Figure 1B:
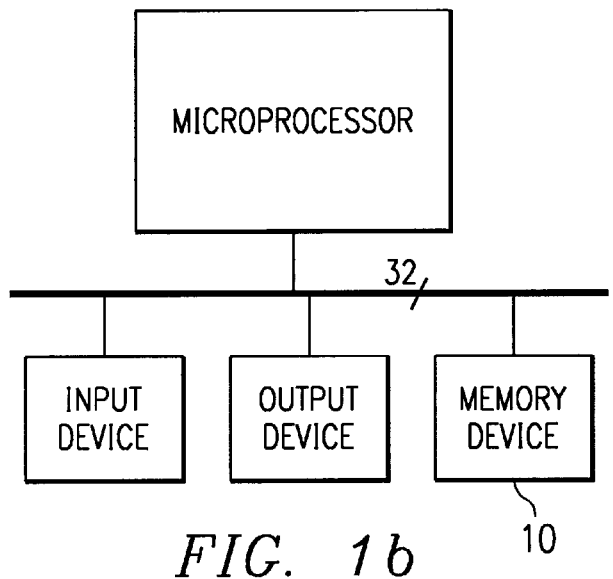
FIG. 1b is an electrical diagram, is block form, of a computer containing the integrated circuit memory device.

FIG. 1a shows a memory 10 that can be used in a computer shown in 1b. The preferred embodiment of the invention can be incorporated into the memory shown in FIG. 1a. In this example, memory 10 is a 32K×32 Burst Static Random Access Memory (Burst SRAM). The memory can have its memory cells in a single block or in multi blocks. In the preferred embodiment of the invention the memory device 10 has an even number of blocks. In the present example thirty-two blocks $B_0, \ldots B_{31}$ are shown.

The memory cells in memory device 10 are grouped into rows and columns. In this example, as is conventional, a row refers to the array direction in which a plurality of memory cells are 0selected by way of a word line. A column refers to the array direction in which memory cells in the selected row are selected for reading or writing.

The blocks $B_0, \ldots B_{31}$, are divided into 4 quadrants $Q_0$, $Q_1$, $Q_2$, $Q_3$ of 8 blocks each. A master wordline decoder 12 runs through the center of the memory device 10. Master wordlines $MWL_0, MWL_1, MWL_2, MWL_3$ run through each quadrant. Local wordline decoders $LWD_0, LWD_{15}$ are located between each of pair of blocks.

Block input/output circuitry $14_0 \ldots 14_{31}$ is associated with each block. Input/output buffers, sense amplifiers, and row and address decoders are located in the block input/output circuitry $14_0 \ldots 14_{31}$, between the block input/output circuitry or in the central regions 12, $18_0$, $18_1$, of the memory device 10. In the preferred embodiment, the memory device 10 can receive 32 bits of data simultaneously or output 32 bits of data simultaneously. This can be achieved by simultaneously accessing 8 memory cells in each of four block, or by accessing one memory cell in each of the 32 blocks $B_0, \ldots B_{31}$. Bonding pads are provided for connecting to the input/output pins DQ0 . . . DQ3 1, as well as voltage supply lines, address lines A0 . . . A14, and other electrical connections.

Power supply terminals are connected to the voltage supply lines. Power supply terminals 22, 20 are connected to the ground voltage, Vss, and the power-supply voltage, Vcc, respectively, for powering the memory device 10. Power supply terminals $V_{SSQ}$ and $V_{CCQ}$ are connected to the ground voltage and the power-supply voltage respectively, for powering the input/output pins DQ0 . . . DQ31. The address of memory cells where the data is stored are decoded to drive the master word lines $MWL_0$ . . . $MWL_3$. The master word lines $MWL_0$ . . . $MWL_3$ are connected to the local word drivers $LWD_0$ . . . $LWD_{15}$, and through the local word drivers to the local wordlines, which are in turn connected to the memory cells. This allows the data on the input/output pins DQ0 . . . DQ31 to be written to the memory cells.

Figure 4:
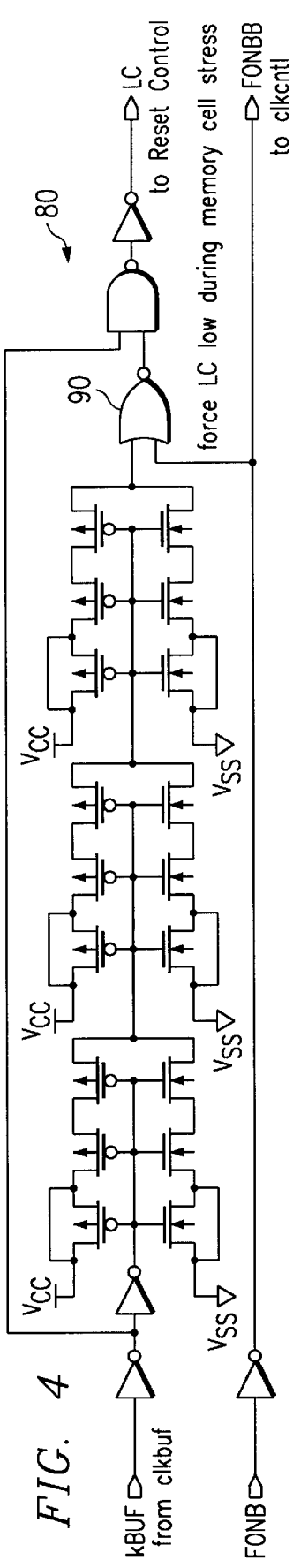
FIG. 4 is an electrical diagram, in schematic form, of a test cycle reset circuit.

The memory device 10 contains operational circuitry for operating in the normal operating mode, this can be any conventional circuitry that allows the memory device to operate in the conventional normal operating mode. In the preferred embodiment of the invention this includes a clock, a plurality of wordlines and wordline drivers, as described above, an asynchronous pin input buffer 50, a block reset control circuit 100, shown in FIG. 4, and a data input buffer 140, shown in FIG. 6. In the preferred embodiment there is one block reset control circuit for every two block in the memory device. The memory device also contains test mode circuitry, connected to the normal operating mode circuitry, for operating the memory device in a test mode.

Figure 2:
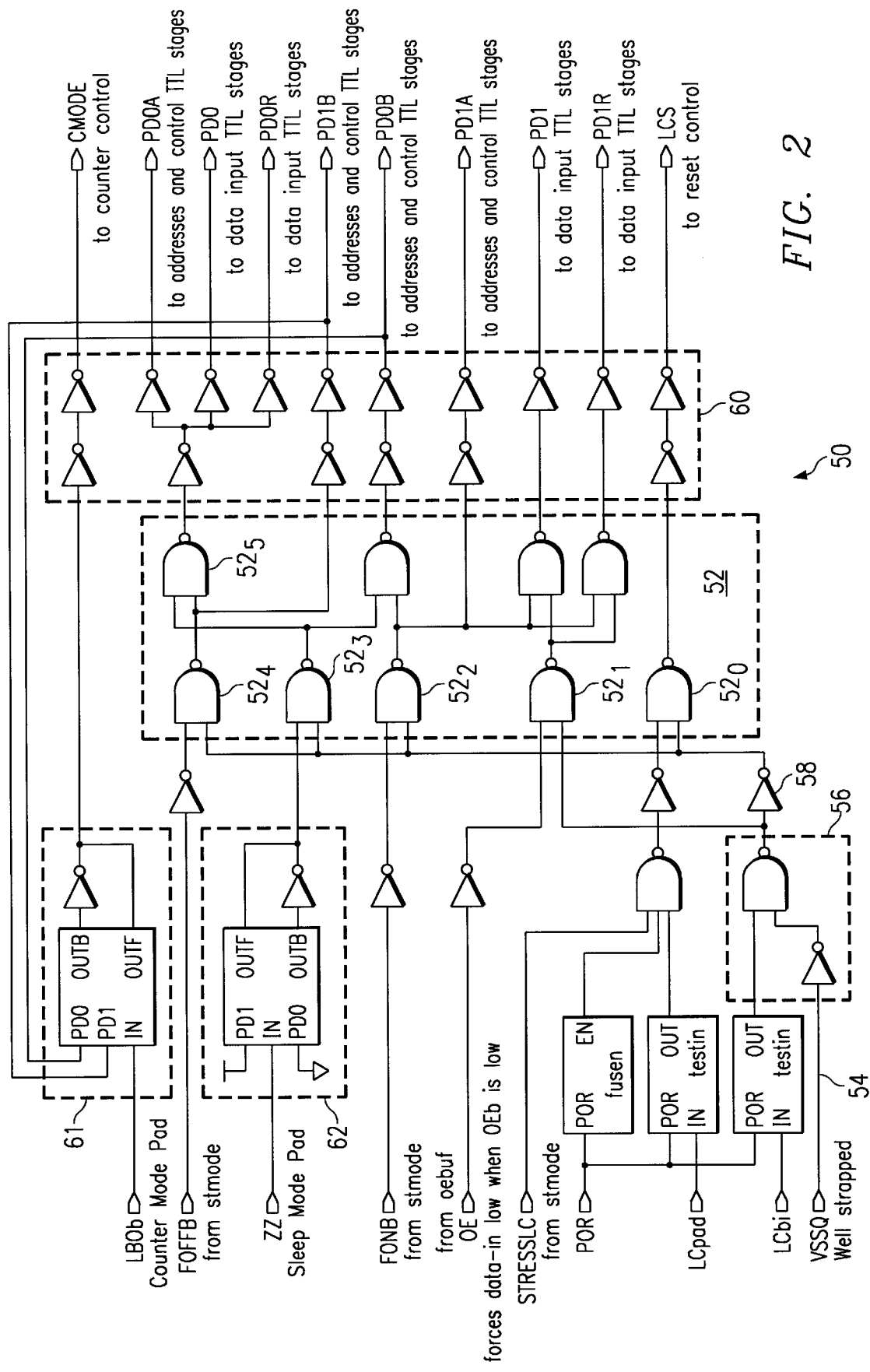
FIG. 2 is an electrical diagram, in schematic form, of an asynchronous pin input buffer.

FIG. 2 shows one embodiment of asynchronous pin input buffer 50. A test mode input 54 is connected to a first power supply terminal, which is connected to a voltage supply line. The first power supply terminal can be either $V_{SSQ}$, which is connected to ground, or $V_{CCQ}$, which is connected to Vcc. In the present example the first power supply terminal is connected to $V_{SSQ}$. In the normal operation mode $V_{SSQ}$ and $V_{CCQ}$ supply power to the input/output pins DQ0 . . . DQ31 and to the write drivers.

In certain test modes, particularly in the burn-in test mode, data is only written to the memory cells and not read out of them. Therefore, the logic state on the first power supply terminal $V_{SSQ}$ can be changed to a first logic state from a second logic state in which the first power supply terminal operates in the normal operating mode without effecting the results of the burn-in test.

The burn-in test is entered by setting the first power supply terminal $V_{SSQ}$ to the first logic state, in this case high. In the normal operation mode of the memory device, first power supply terminal $V_{SSQ}$ is connected to ground, making the second logic state low. (When the first power supply terminal is $V_{CCQ}$ the second logic state is high and the burn-in test mode would be entered by setting the first power supply terminal $V_{CCQ}$ to the first logic state, low in this case.

Entering the burn-in test mode by placing the opposite logic state on a pin that is only set to one state in the normal operating mode, like one of the input/output pins' power supply pins, i.e. on the first power supply terminal, eliminates the need to have an extra test pin, or to enter the burn-in test mode through either clocking and latching test conditions on the memory device 10 or placing a voltage above which the memory device normally operates on a pin. This provides the advantage of allowing all of the pins of the memory device 10 to be used for some function during normal operation of the memory device 10. Additionally, since the user will not set the first power supply terminal to the opposite logic state in normal operation this provides the advantage that the user will not enter the burn-in test mode accidentally.

The test mode input 54 is coupled to first power supply terminal $V_{SSQ}$, and is at the same logic state. The test mode input is connected to the test mode cycle output LCS, the first power down output PD0, the second power down output PD1. When the memory device is in the burn-in test mode the test mode cycle output LCS is at the same logic state as the test mode input 54 (when the first power supply output is $V_{CCQ}$ instead of $V_{SSQ}$ LCS would have the opposite state as the test mode input 54). The first power down output PD0 is at the opposite logic state as the test mode input during the burn-in test mode (again when the first power supply output is $V_{CCQ}$ the first power down output would be at the same as the test mode input 54). The logic state on the second power down output PD1 is responsive to the logic state on the test mode write data pin OE. In the preferred embodiment the test mode write data pin OE is the output enable complement pin. The test mode write data pin OE is coupled to an input iof the asynchronous pin input buffer 50 during the burn-in test mode. Any circuit which ensures the above logic states can be used as the asynchronous pin input buffer 50. A preferred embodiment of the asynchronous pin input buffer 50 is illustrated in FIG. 2.

In the preferred embodiment, asynchronous pin input buffer 50 consists of first delay circuit 56 coupled between the test mode input 54 and an inverter 58, which is connected to control circuit 52. Control circuit 52 is connected to all of the outputs of the asynchronous pin input buffer 50 through a second delay circuit 60. The entrance of other functional modes of the memory device such as the sleep mode, controlled by input ZZ, and other test modes such as the stress mode, controlled by FONB and FOFFB can also be controlled through the asynchronous pin input buffer.

In the burn-in test mode, the output of the first delay circuit 56 is high, so first delay circuit contains an even number of logic elements that invert the signal passing through it. (When the first power supply output is $V_{CCQ}$ instead of $V_{SSQ}$ the number of elements should be odd.) The signal is then brought low through inverter 58 and forces NAND gate 52₀ high. This passes through the second delay circuit 60 to bring the test mode cycle output LCS high. In the normal operation mode the output of the first delay circuit is high, forcing NAND gate 52₀ low. This brings the test mode cycle output LCS low.

Figure 3:
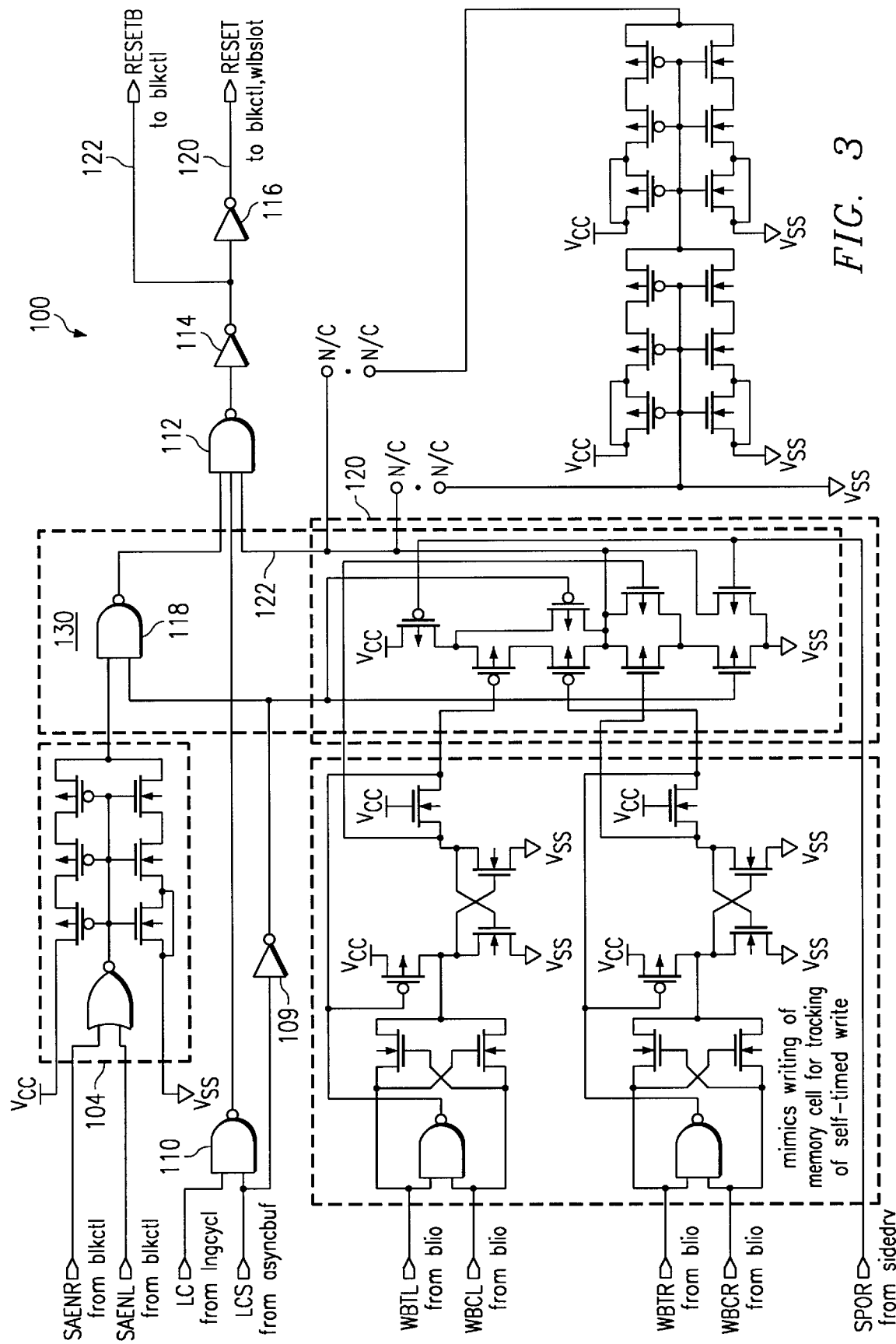
FIG. 3 is an electrical diagram, in schematic form, of a block reset control circuit.

The test mode cycle output LCS is connected to an input of the block reset control circuit shown in FIG. 3. During the normal operation mode, the test mode cycle output LCS is low. This allows the output of the disable circuit 104 to control NAND gate 118. It also allows the output of the memory simulation circuitry 106 to control circuit 120. The test mode cycle output LCS is also an input of NAND gate 110, and forces it high, allowing the disable circuit 104 and the memory simulation circuitry 196 to control NAND gate 112, which produces the reset 120 and reset complement 122 signals. In the preferred embodiment both the disable 104 and the memory simulatopm 105 circuit are present, however any reset control circuitry that can control the reset of the memory to allow operation of the circuit in the normal operation mode can be used. The output of any such reset control circuitry is connected to a test mode disabling circuit 130 that permits the output of such circuitry to control the test mode disabling circuit 130 when the test mode cucle output LCS is low, and permits the test mode cycle output LCS to control the test mode disabling circuit 130 when the first test cycle output LCS is high. In the preferred embodiment the test mode disabling circuit 130 contains the NAND gate 118 and circuit 120. Any disable 104 and memory simulation 106 being circuits can be used, a preferred embodiment of the disable 104 and memory simulation 106 circuits is described in detail in co-pending application "Circuit and Method for Setting the Time Duration of a Write to a Memory Cell," U.S. Ser. No. 08/587,711, incorporated by reference hereinabove.

During the burn-in test mode the test mode cycle output LCS is high. This brings the output of inverter 109 low, driving the output of NAND gate 118 and the output 122 of circuit 120 high. This allows the output of NAND gate 110 to control the output NAND gate 112, which produces the reset 120 and reset complement 122 signals. Since the test mode cycle output LCS is high, the output of NAND gate 110 is controlled by its other input, which is coupled to the test mode cycle control node LC. When LC is low the output of NAND gate 110 is high, driving NAND gate 112 and thus reset 120 also low. When LC is high the output of NAND gate 110 is low, driving NAND gate 112 high, and generating a reset signal.

The generation of the reset signal causes a write or read to terminate and resets other circuits of the memory block to be ready for a subsequent read or write. The reset signal is input to a number of circuits on the memory device 10, including the block read/write control and the word line and block select latch. When the reset signal is enabled, a write is not permitted and enabling the reset signal forces the termination of a write or read and prepares the circuit for a subsequent write or read.

By permitting the reset signal to be controlled only by the logic state on the test mode cycle control node LC during the burn-in test mode, but disabling the test mode cycle control node LC through NAND gate 110 during the normal operation mode of the memory, the time the memory device is active can be increased during the burn-in test mode by controlling the logic state on the test mode cycle control node LC. This can be accomplished by connecting the test mode cycle control node LC to a pin which can be connected to an external clock or any other device that can produce the changes in the logic states on the test mode cycle control node LC at the desired frequency, or by connecting the test mode cycle control node LC to the internal clock of the memory device 10 and increasing the cycle time and clock high time of the internal clock. In the preferred embodiment, the test mode cycle, control node LC is connected to the internal clock of the memory device through a test cycle reset circuit 80, shown in FIG. 4. The input of test cycle reset circuit 80 is the clock signal 82. This signal is then passed through the inverting delay elements of the test cycle reset circuit 80 to produce the opposite logic state at the output, which is the state on the test mode cycle control node LC. Therefore, when the clock goes from high to low the test mode cycle control node LC is brought high, generating a reset signal.

Increasing the cycle time and the effective time active cycle time (in the preferred embodiment the time the clock is high) of the memory device during the burn-in mode allows the wordlines and bitlines to be exercised during each burn-in cycle for a longer period than the normal operating cycle of the memory device. By increasing the cycle time of the memory device's internal clock to be the same as the burn-in cycle, the wordlines and bitlines can be exercised for practically the entire duration of the burn-in cycle. Since the effective time active of the memory device in the normal operation mode is typically several orders of magnitude smaller than the effective active cycle time of the burn-in cycle, the time saved by activating the wordline and bitlines for almost the entire burn-in cycle using the present invention is also quite large and results in large saving in manufacturing costs.

To exercise the wordlines and bitlines of the memory device a wordline of the memory device is driven to a first logic state, e.g. high, thus writing one to one or plurality of memory cells in the memory device 10. (In the preferred embodiment of the invention a wordline can be selected in each of the quadrants at the same time and eight cells associated with each are written to.) The wordline is enabled when the clock switches to a first logic state, e.g. high. When the clock switches to a second logic state, e.g. low, a reset signal is generated terminating the write and preparing all of the circuits of the memory device for the subsequent write. In the prior art the reset signal was dependent on the normal operation mode cycle time of the memory device, so the reset was self-timed and the length of time a wordline remained active could not be changed.

When a one or a plurality of wordline is selected a zero is written to all of memory cell associated with the other wordlines. Thus, the memory cell of the memory device are exercised in both data states. On the next cycle, when the clock again enters the first logic state a subsequent wordline is driven high, thus all of the wordlines are eventually exercised.

Figure 5:
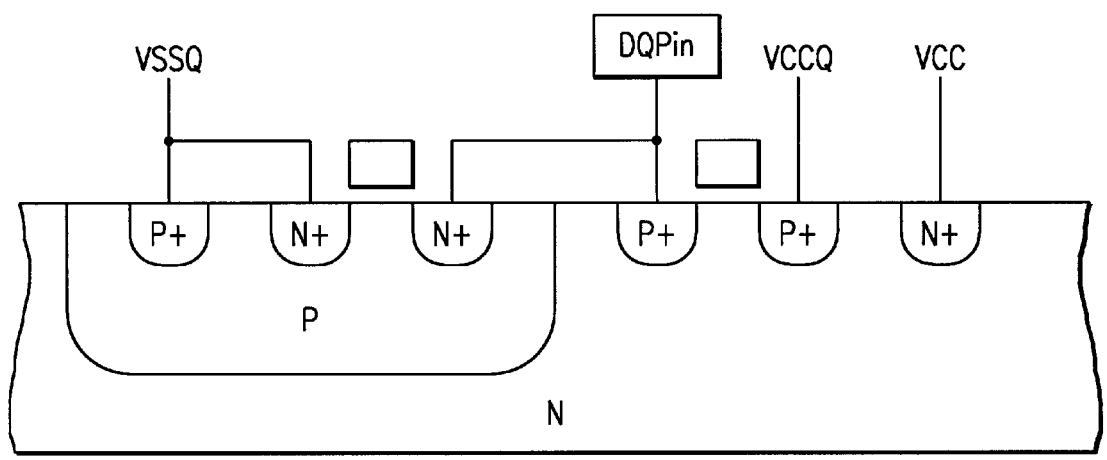
FIG. 5. is a cross-sectional view of the output driver.

Keeping one of the input/output pins' power supply pins at the first logic state throughout the burn-in test mode can pose a problem in writing both states to the memory cells. As illustrated in FIG. 5, the input/output pins and the first power supply terminal are connected to the output driver. Because the power supply pins were meant to be at the second logic state bringing one of them to the first logic state may require that the input/output pin is also brought to the first logic state. If the logic state of the input/output pins is not the same as the logic state of the first power supply terminal this will result in a forward biased injunction. For example, when the first power supply terminal is $V_{SSQ}$, and it is brought to Vcc, the data input/output pins should be kept at Vcc during the burn-in test mode to prevent a forward biased pn junction. However, now only ones can be written to the memory cells, zeros could not be written. This is solved by using any one pin not required in the burn-in test mode as the test mode write data pin to generate the data states that are written. Because the same data state will be written to all of the memory cell only one pin is need to determine what will be written. Since the input/output pins are not being used to write the data the output enable complement pin OE is not needed during the burn-in mode to enable the input/output pins, and can be used as the test mode write data pin.

Referring again to the asynchronous pin input buffer 50 shown in FIG. 2, the high at the output of first delay circuit 56 is then brought low through inverter 58 and forces NAND gates 523 and 524 high, forcing NAND gate 525 low. This low is then passed through the second delay circuit 60 to the first power down output PDO. Therefore, PDO is low through the entire burn-in test mode. The high at the output of first delay circuit 56 also allows the state on the test mode write data pin OE to control NAND gate 52, and to pass through the second delay circuit 60 to the second power down output PD1.

The first and second power down outputs PD0, PD1 are inputs of the data input buffer 140, illustrated in FIG. 6. The data input buffer 140 also receives the data from the input/output pins on the data line 162. The data true and complement signals DT, DC are the outputs of the data input buffer and are the inputs of the write driver. A write driver that writes to the memory cells responsive to the data true and complement signals can be used. These inputs are connected to the input buffer 160. In the normal operation mode of the memory device the signal the output of input buffer 164 is at the opposite logic state of the signal on the data line 162. This is then inverted through inverter 168. The signal at the output 165 of the inverter 168 brings the data true signal DT to the same logic state as the output 165 of the inverter, and brings the data complement signal DC to the opposite state. In the preferred embodiment the signal at the output 165 passes through delay circuit 142, is latched by the latch circuit 144 and passes through the first driver circuit 143 to become the data true signal DT, as shown in FIG. 6. Similarly the signal at the output 165 passes through delay circuit 142, is latched by the latch circuit 144, and passes through the test logic circuit 146 and is then inverted by the second driver circuit 145 to become the data complement signal DC.

Figure 7:
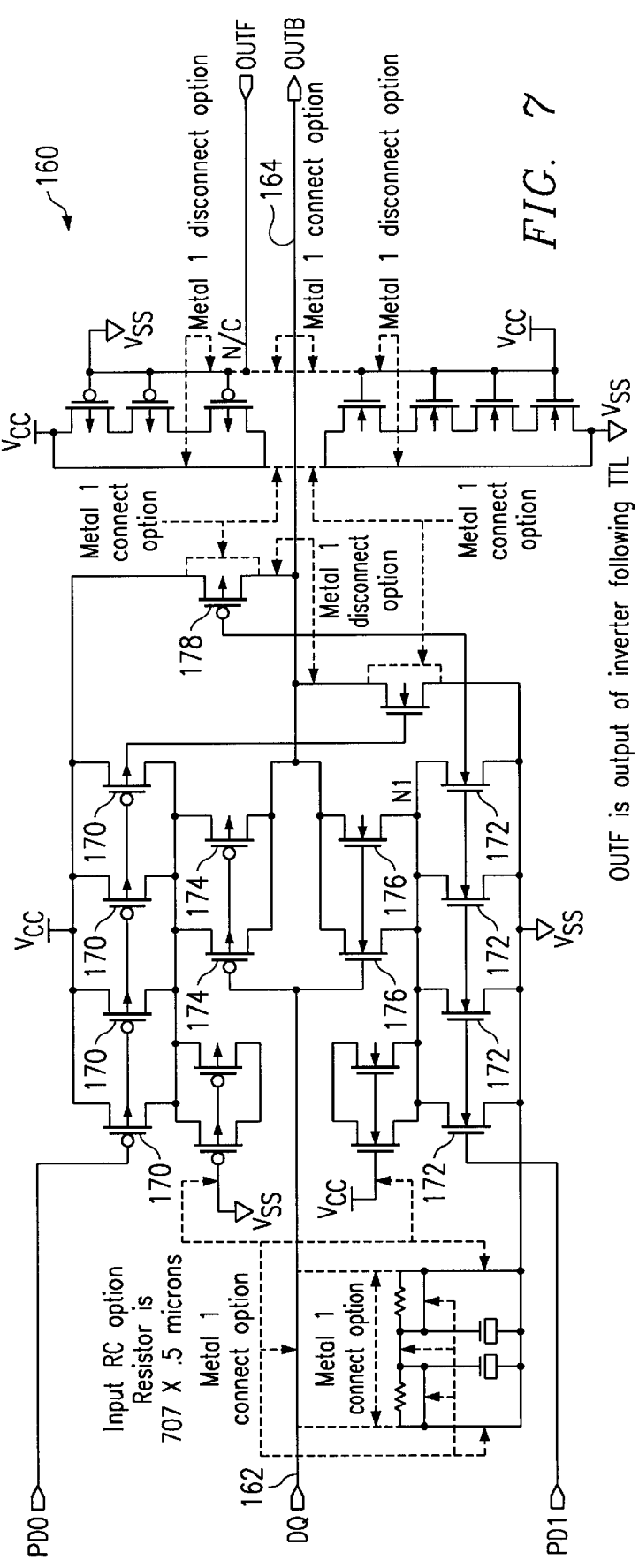
FIG. 7 is an electrical diagram, in schematic form, of the input buffer.

In the burn-in test mode the signal the output of input buffer 164 is at the opposite logic state of the signal on the second power down line PD1, this means that the logic state of the signal on the test mode write data pin OE instead of the signal on the input/output pins determines the data state to be written. A preferred embodiment of the input buffer is shown in FIG. 7. When the second power down output PD1 is high, transistors 172 are on. Since transistors 172 are connected between ground and node NI, node NI is brought low. During the burn-in test mode, when $V_{SSQ}$ is used to enter into the burn-in test mode, the signal on the input/output pin is high, turning transistors 174 off and transistors 176 on, this brings the output 164 of the input buffer 160 low. When the second power down output PD1 is low, transistors 172 are off and transistor 178 is on. Since transistor 178 is connected between Vcc and the output 164, the output 164 is brought high.

Using a pin not required in the burn-in test mode to determine the state of the data to be written to the memory cells in memory device 10 during the burn-in test mode allows the power supply terminal of the input/output pins to be used to enter the burn-in test mode by setting it to the opposite logic state of what it would be set in the normal operation mode of the memory device. This provides the advantages of not requiring a separate test pin that cannot be used in the normal operation mode of the memory device. This also provides the advantage that the user of the memory device will not enter the test mode accidentally during the normal operation mode since the power supply terminal of the input/output pins will be set to the state needed for them to operate properly and not to its opposite state, which causes the entrance to the burn-in test mode simplifying burn-in oven signal requirements.

While the invention has been specifically described with reference to a preferred embodiment, it will be understood by those of ordinary skill in the prior art having reference to the current specification and drawings that various modifications may be made and various alternatives are possible therein without departing from the spirit and scope of the invention.

For example:

While the invention is described with reference to a burn-in test mode, any other test mode can be used where data is only written and not read out, or where it is not needed for the data read out on the input/output pins to be an accurate.

Additionally, while the invention is described in reference to a burn-in test mode where the wordlines are activated sequentially, it can be used in a test mode where the wordlines are activated simultaneously.

Although the invention is described in relation to SRAMs the invention can be used in other types of memories having memory arrays including redundant columns, including read-only memories, FIFOs, DRAMs, EPROMs, EEPROMs, and microprocessors and other devices which have embedded memories without departing from the scope of the invention.

I claim:

1. A method for stressing a memory device, comprising:
    entering a test mode by setting a power node to a first logic state;
    enabling a wordline of said memory device;
    writing to a plurality of memory cells coupled to said wordline;
    entering a normal operation mode of said memory device by setting said power node to a second logic state, said second logic state being complementary in logic level to said first logic state; and
    resetting said memory device while said memory device is in said test mode when a test mode controlled signal generated by a timing device switches from a first to a second logic state.

2. The method of claim 1 wherein said timing device is a clock.

3. A method of activating a test mode of operation of an integrated circuit, wherein said integrated circuit comprises an electrical circuit for operation of said integrated circuit in a normal mode of operation, a test mode circuit for operation of said integrated circuit in said test mode of operation, and a plurality of input/output pins from said integrated circuit, said method comprising the steps of:
    assigning a first signal to one of said plurality of input/output pins during said normal mode of operation;
    assigning a second signal to said one of said plurality of input/output pins during said test mode of operation; and
    activating said test mode circuit for operation of said integrated circuit in said test mode of operation as a consequence of said assignment of said second signal.

4. The method according to claim 3, further comprising the steps of:
    setting said first signal to one state in said normal mode of operation of said integrated circuit; and
    setting said second signal to a logic level complementary to said first signal's logic level.

5. The method according to claim 3, further comprising the step of setting said second signal to $V_{cc}$.

6. The method according to claim 3, further comprising the step of setting said second signal to ground.

7. A method of operating an integrated circuit memory device, wherein said integrated circuit memory device comprises an electrical circuit for operation of said integrated circuit memory device in a normal mode of operation, a test mode circuit for operation of said integrated circuit memory device in a test mode of operation, and a plurality of output pins from said integrated circuit memory device, comprising the steps of:
    assigning a first signal to one of said plurality of output pins during said normal mode of operation;
    assigning a second signal to said output pin during said test mode of operation;
    activating said test mode circuit as a consequence of said assignment of said second signal; and
    operating said integrated circuit memory device in said test mode of operation as a consequence of said activation of said test mode circuit.

8. The method according to claim 7, further comprising the steps of:

setting said first signal to a normal state in said normal mode of operation of said integrated circuit; and setting said second signal to be complimentary in logic level to said normal state.

9. The method according to claim 7 wherein said second signal comprises $V_{CC}$.

10. The method according to claim 7 wherein said second signal comprises ground.

* * * * *